US012580165B2

(12) United States Patent
Won

(10) Patent No.: US 12,580,165 B2
(45) Date of Patent: Mar. 17, 2026

(54) APPARATUS FOR TREATING SUBSTRATE AND METHOD FOR MEASURING DEGREE OF WEAR OF CONSUMABLE COMPONENT

(71) Applicant: Semes Co., Ltd, Cheonan-si (KR)

(72) Inventor: Chul Ho Won, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 403 days.

(21) Appl. No.: 17/496,209

(22) Filed: Oct. 7, 2021

(65) Prior Publication Data

US 2022/0122807 A1     Apr. 21, 2022

(30) Foreign Application Priority Data

Oct. 15, 2020     (KR) ........................ 10-2020-0133205

(51) Int. Cl.
| | |
|---|---|
| *H01J 37/32* | (2006.01) |
| *G01B 11/06* | (2006.01) |
| *H01L 21/66* | (2006.01) |
| *H01L 21/67* | (2006.01) |
| *H01L 21/687* | (2006.01) |

(52) U.S. Cl.
CPC .......... *H01J 37/3288* (2013.01); *G01B 11/06* (2013.01); *H01J 37/32642* (2013.01); *H01J 2237/24585* (2013.01); *H01J 2237/334* (2013.01); *H01L 21/67276* (2013.01); *H01L 21/68742* (2013.01); *H01L 22/12* (2013.01); *H01L 22/30* (2013.01)

(58) Field of Classification Search
None
See application file for complete search history.

(56) References Cited

U.S. PATENT DOCUMENTS

| | | | |
|---|---|---|---|
| 2006/0157698 A1 | 7/2006 | Miyajima | |
| 2008/0071408 A1* | 3/2008 | Hiroki | ................... H01L 21/681 |
| | | | 700/114 |
| 2010/0025369 A1* | 2/2010 | Negishi | ............. H01J 37/32642 |
| | | | 216/60 |
| 2015/0010381 A1 | 1/2015 | Cai | |
| 2017/0117172 A1 | 4/2017 | Genetti et al. | |

(Continued)

FOREIGN PATENT DOCUMENTS

| | | | |
|---|---|---|---|
| CH | 680275 A5 | 7/1992 | |
| CN | 107093569 A * | 8/2017 | ........ H01L 21/67011 |

(Continued)

OTHER PUBLICATIONS

Korean Office Action dated Jan. 31, 2023 issued in corresponding Korean Appln. No. 10-2020-0133205.

(Continued)

*Primary Examiner* — Karla A Moore
(74) *Attorney, Agent, or Firm* — Harness, Dickey & Pierce, P.L.C.

(57) ABSTRACT

An apparatus for treating a substrate includes a process chamber having a process space, a support unit that supports the substrate in the process space, a lift pin module having a lift pin that moves a consumable component on the support unit in an up/down direction, and a measurement unit that measures a degree of wear of the consumable component and has a light receiving member that receives light emitted in a horizontal direction.

13 Claims, 14 Drawing Sheets

(56) References Cited

U.S. PATENT DOCUMENTS

| | | | |
|---|---|---|---|
| 2017/0236741 A1* | 8/2017 | Angelov | H01J 37/32715 29/559 |
| 2017/0263478 A1* | 9/2017 | McChesney | H01J 37/20 |
| 2018/0138069 A1* | 5/2018 | Tan | H01L 21/67248 |
| 2018/0301322 A1* | 10/2018 | Sugita | H01J 37/32642 |
| 2019/0035671 A1* | 1/2019 | Ha | H01L 21/68742 |
| 2019/0385880 A1* | 12/2019 | Myles | H01L 21/68 |
| 2020/0111648 A1 | 4/2020 | Ogata | |
| 2020/0161101 A1* | 5/2020 | Ogata | H01J 37/32715 |
| 2020/0273678 A1* | 8/2020 | Funk | H01J 37/32642 |
| 2020/0411390 A1* | 12/2020 | Yang | H01L 21/68735 |
| 2023/0413446 A1* | 12/2023 | Criminale | H05K 1/183 |

FOREIGN PATENT DOCUMENTS

| | | | |
|---|---|---|---|
| JP | S6221649 A | 1/1987 | |
| JP | S63300525 A | 12/1988 | |
| JP | H0652753 B2 | 7/1994 | |
| JP | H07118502 B2 | 12/1995 | |
| JP | 2001-230239 A | 8/2001 | |
| JP | 2002-176030 A | 6/2002 | |
| JP | 3611543 B2 | 1/2005 | |
| KR | 2005-0005031 A | 1/2005 | |
| KR | 10-2017-0022907 A | 3/2017 | |
| KR | 10-2017-0053551 A | 5/2017 | |
| KR | 10-2019-0040912 A | 4/2019 | |
| KR | 10-2020-0056942 A | 5/2020 | |
| WO | WO-2019112903 A1 * | 6/2019 | H01J 37/3299 |

OTHER PUBLICATIONS

U.S. Office Action dated Jan. 29, 2025 in related U.S. Appl. No. 18/505,289.

U.S. Office Action dated Feb. 5, 2025, in related U.S. Appl. No. 18/505,319.

U.S. Office Action dated Jul. 24, 2025 for corresponding U.S. Appl. No. 18/505,319.

U.S. Office Action dated Jul. 11, 2025 for corresponding U.S. Appl. No. 18/505,289.

* cited by examiner

FIG. 16

APPARATUS FOR TREATING SUBSTRATE AND METHOD FOR MEASURING DEGREE OF WEAR OF CONSUMABLE COMPONENT

CROSS-REFERENCE TO RELATED APPLICATIONS

A claim for priority under 35 U.S.C. § 119 is made to Korean Patent Application No. 10-2020-0133205 filed on Oct. 15, 2020, in the Korean Intellectual Property Office, the entire contents of which are hereby incorporated by reference.

BACKGROUND

Embodiments of the inventive concept described herein relate to an apparatus for treating a substrate and a method for measuring a degree of wear of a consumable component.

Plasma refers to an ionized gaseous state of matter containing ions, radicals, and electrons. Plasma is generated by heating a neutral gas to a very high temperature or subjecting the neutral gas to a strong electric field or an RF electromagnetic field. A semiconductor element manufacturing process may include an etching process of removing a thin film on a substrate, such as a wafer, using plasma. The etching process is performed by collision or reaction of ions and/or radicals contained in the plasma with the thin film on the substrate.

An apparatus for treating a substrate using plasma includes a process chamber under a vacuum atmosphere, a support chuck that supports the substrate in the process chamber, and a focus ring that surrounds the substrate seated on the support chuck. The focus ring is installed to uniformly distribute plasma on the surface of the substrate and is etched together with the substrate by the plasma. As an etching process is repeatedly performed on substrates, the focus ring is also etched together so that the shape of the focus ring is gradually changed. Due to the change in the shape of the focus ring, the direction in which ions and/or radicals are incident on a substrate is changed, and therefore etching characteristics for the substrate are changed. Accordingly, when an etching process is performed on a predetermined number or more of substrates, or when the shape of the focus ring is changed to deviate from an allowable range, it is necessary to replace the focus ring.

To perform the replacement of the focus ring at the appropriate time, it is important to identify the degree of wear (e.g., the etch amount) of the focus ring. In general, an operator directly opens the process chamber and identifies the degree of wear of the focus ring, or brings a measuring instrument, such as a measuring jig, into direct contact with the focus ring and identifies the degree of wear of the focus ring. However, in the former case, it may be difficult to appropriately identify the degree of wear of the focus ring at the required time, and in the latter case, the focus ring may be damaged (e.g., scratched) by the physical contact between the focus ring and the measuring instrument.

SUMMARY

Embodiments of the inventive concept provide a substrate treating apparatus and a consumable-component wear measuring method for effectively measuring a degree of wear of a consumable component.

Embodiments of the inventive concept provide a substrate treating apparatus and a consumable-component wear measuring method for effectively measuring an etch amount of a ring member, for example, a focus ring.

The technical problems to be solved by the inventive concept are not limited to the aforementioned problems, and any other technical problems not mentioned herein will be clearly understood from the following description by those skilled in the art to which the inventive concept pertains.

According to an embodiment, an apparatus for treating a substrate includes a process chamber having a process space, a support unit that supports the substrate in the process space, a lift pin module having a lift pin that moves a consumable component on the support unit in an up/down direction, and a measurement unit that measures a degree of wear of the consumable component and has a light receiving member that receives light emitted in a horizontal direction.

According to an embodiment, the apparatus may further include a controller, and the controller, when measuring the degree of wear of the consumable component, may control the lift pin module to move the consumable component to a position where the consumable component interferes with the light.

According to an embodiment, the controller may calculate the degree of wear of the consumable component, based on a measured height that is a height of the lift pin when an amount of light received by the light receiving member decreases.

According to an embodiment, the controller may control the lift pin module such that the lift pin moves a new consumable component to a position where the new consumable component interferes with the light, may store a reference height that is a height of the lift pin when the new consumable component interferes with the light and an amount of light received by the light receiving member decreases, and may calculate the degree of wear of the consumable component, based on a difference between the reference height and the measured height.

According to an embodiment, the process chamber may include a view port on which the light receiving member is installed, and an irradiation member that emits the light may be attached to a substrate type sensor that is transported into the process space and that monitors a substrate treating process performed in the process chamber.

According to an embodiment, the process chamber may include a plurality of view ports. The light receiving member may be installed on one of the view ports, and an irradiation member that emits the light may be installed on another one of the view ports.

According to an embodiment, the apparatus may further include a transfer chamber including a transport robot that transports the substrate into the process space. The process chamber may include a view port on which the light receiving member is installed. An irradiation member that emits the light may be installed in the transfer chamber.

According to an embodiment, the irradiation member and the light receiving member may be provided at the same height.

According to an embodiment, the process chamber may have an entrance/exit opening formed therein through which the substrate enters and exits the process chamber, and the entrance/exit opening, the irradiation member, and the light receiving member may be disposed along a virtual straight line when viewed from above.

According to an embodiment, the consumable component may have a ring shape.

According to an embodiment, an apparatus for treating a substrate includes a process chamber having a process space, a gas supply unit that supplies a process gas into the process space, a power supply unit that excites the process gas into plasma, a support unit that supports the substrate in the process space, a lift pin module including a lift pin that moves the substrate or a ring member on the support unit in an up/down direction and a lifting unit that raises and lowers the lift pin, and a measurement unit that measures an etch amount of the ring member and has a light receiving member that receives light emitted in a horizontal direction.

According to an embodiment, the apparatus may further include a controller, and the controller, when measuring the etch amount of the ring member, may control the lift pin module to move the ring member to a position where the ring member interferes with the light.

According to an embodiment, the controller may calculate the etch amount of the ring member, based on a measured height that is a height of the lift pin when an amount of light received by the light receiving member decreases.

According to an embodiment, the controller may control the lift pin to move a new ring member to a position where the new ring member interferes with the light, may store a reference height that is a height of the lift pin when the new ring member interferes with the light and an amount of light received by the light receiving member decreases, and may calculate the etch amount of the ring member, based on a difference between the reference height and the measured height.

According to an embodiment, the process chamber may include a view port on which the light receiving member is installed, and an irradiation member that emits the light may be attached to a substrate type sensor that is transported into the process space and that monitors a substrate treating process performed in the process chamber.

According to an embodiment, the process chamber may include a plurality of view ports. The light receiving member may be installed on one of the view ports, and an irradiation member that emits the light may be installed on another one of the view ports.

According to an embodiment, the apparatus may further include a transfer chamber including a transport robot that transports the substrate into the process space. The process chamber may include a view port on which the light receiving member is installed. An irradiation member that emits the light may be installed in the transfer chamber.

According to an embodiment, a method for measuring a degree of wear of a consumable component provided in a substrate treating apparatus for treating a substrate using plasma includes emitting, in a horizontal direction, a laser having a predetermined width, receiving, by a light receiving member installed in the substrate treating apparatus, the laser, moving, by a lift pin of a lift pin module of the substrate treating apparatus, the consumable component in an up/down direction to cause the consumable component to interfere with the laser, deriving a measured height that is a height of the lift pin when an amount of the laser received by the light receiving member decreases, moving, by the lift pin module, a new consumable component to a position where the new consumable component interferes with the laser, and calculating a degree of wear of the consumable component, based on a difference between the measured height and a reference height that is a height of the lift pin when the new consumable component interferes with the laser and an amount of the laser received by the light receiving member decreases.

According to an embodiment, an irradiation member that emits the laser may be attached to a substrate type sensor that is transported into a process chamber and that monitors a substrate treating process, and the process chamber may treat the substrate using the plasma. The substrate type sensor may be transported into the process chamber, and the irradiation member may emit the laser toward the light receiving member.

According to an embodiment, an irradiation member that emits the laser may be installed in a transfer chamber that transports the substrate into a process chamber that treats the substrate using the plasma. The irradiation member may emit the laser toward the light receiving member in a state in which an entrance/exit opening formed in the process chamber is open, and the substrate may enter and exit the process chamber through the entrance/exit opening.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 16 is a view illustrating a substrate treating apparatus according to another embodiment of the inventive concept.

DETAILED DESCRIPTION

Figure 1:
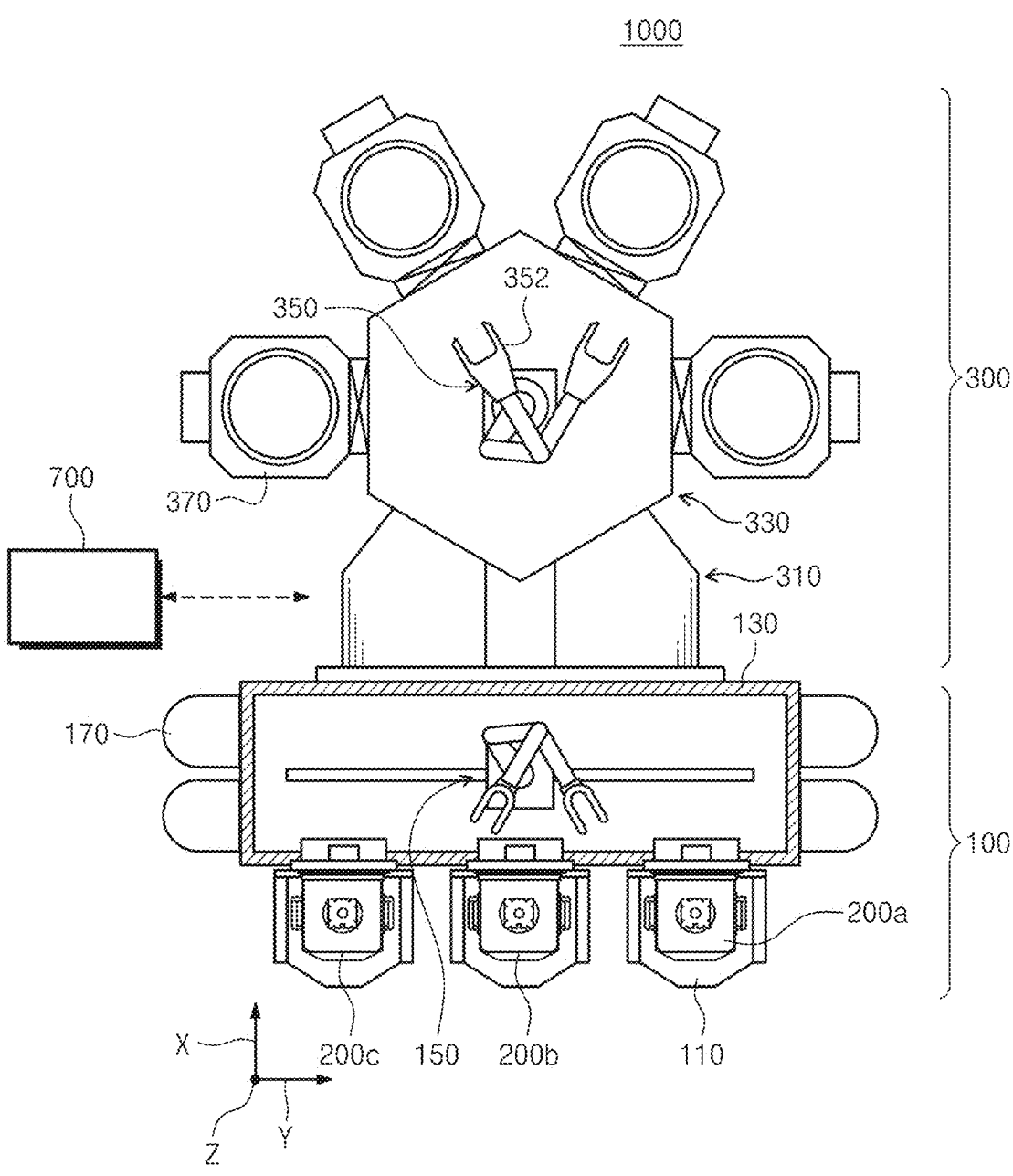
FIG. 1 is a schematic plan view illustrating a substrate treating apparatus according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

The terms such as first, second, and the like may be used to describe various components, but the components should not be limited by the terms. The terms may be used only for distinguishing one component from others. For example, without departing the scope of the inventive concept, a first component may be referred to as a second component, and similarly, the second component may also be referred to as the first component.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

Unless otherwise defined, all terms used herein, including technical or scientific terms, have the same meanings as those generally understood by those skilled in the art to which the inventive concept pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the inventive concept will be described with reference to FIGS. 1 to 15.

FIG. 1 is a schematic plan view illustrating a substrate treating apparatus according to an embodiment of the inventive concept. Referring to FIG. 1, the substrate treating apparatus 1000 according to the embodiment of the inventive concept may include an index unit 100, a process unit 300, and a controller 700. The index unit 100 and the process unit 300 may be arranged in a first direction X when viewed from above. Hereinafter, a direction perpendicular to the first direction X when viewed from above is defined as a second direction Y. Furthermore, a direction perpendicular to the first direction X and the second direction Y is defined as a third direction Z. Here, the third direction Z may refer to the direction perpendicular to the ground.

The index unit 100 may include load ports 110, an index chamber 130, a first transport robot 150, and side buffers 170.

Containers 200a, 200b, and 200c may be seated on the load ports 110. Various types of containers 200a, 200b, and 200c may be seated on the load ports 110. For example, various types of containers 200a, 200b, and 200c having different items accommodated therein may be seated on the load ports 110. For example, ring members R to be transported into process chambers 370 that will be described below and/or a carrier C used to transport the ring members R may be accommodated in the first container 200a among the containers 200a, 200b, and 200c. Furthermore, substrate type sensors WS to be described below may be accommodated in the second container 200b. In addition, substrates W (e.g., wafers) to be treated in the process chambers 370 may be accommodated in the third container 200c.

However, without being limited thereto, at least one of the ring members R, the carrier C, the substrate type sensors WS, or the substrates W may be accommodated in the first container 200a. Similarly, at least one of the ring members R, the carrier C, the substrate type sensors WS, or the substrates W may be accommodated in the second container 200b and the third container 200c.

The containers 200a, 200b, and 200c may be transported and loaded onto the load ports 110, or may be unloaded from the load ports 110 and transported, by a container transport apparatus. The container transport apparatus may be an overhead transport apparatus (OHT). However, the inventive concept is not limited thereto, and the containers 200a, 200b, and 200c may be transported by various apparatuses. Furthermore, an operator may directly load the containers 200a, 200b, and 200c onto the load ports 110, or may directly unload the containers 200a, 200b, and 200c from the load ports 110.

Figure 2:
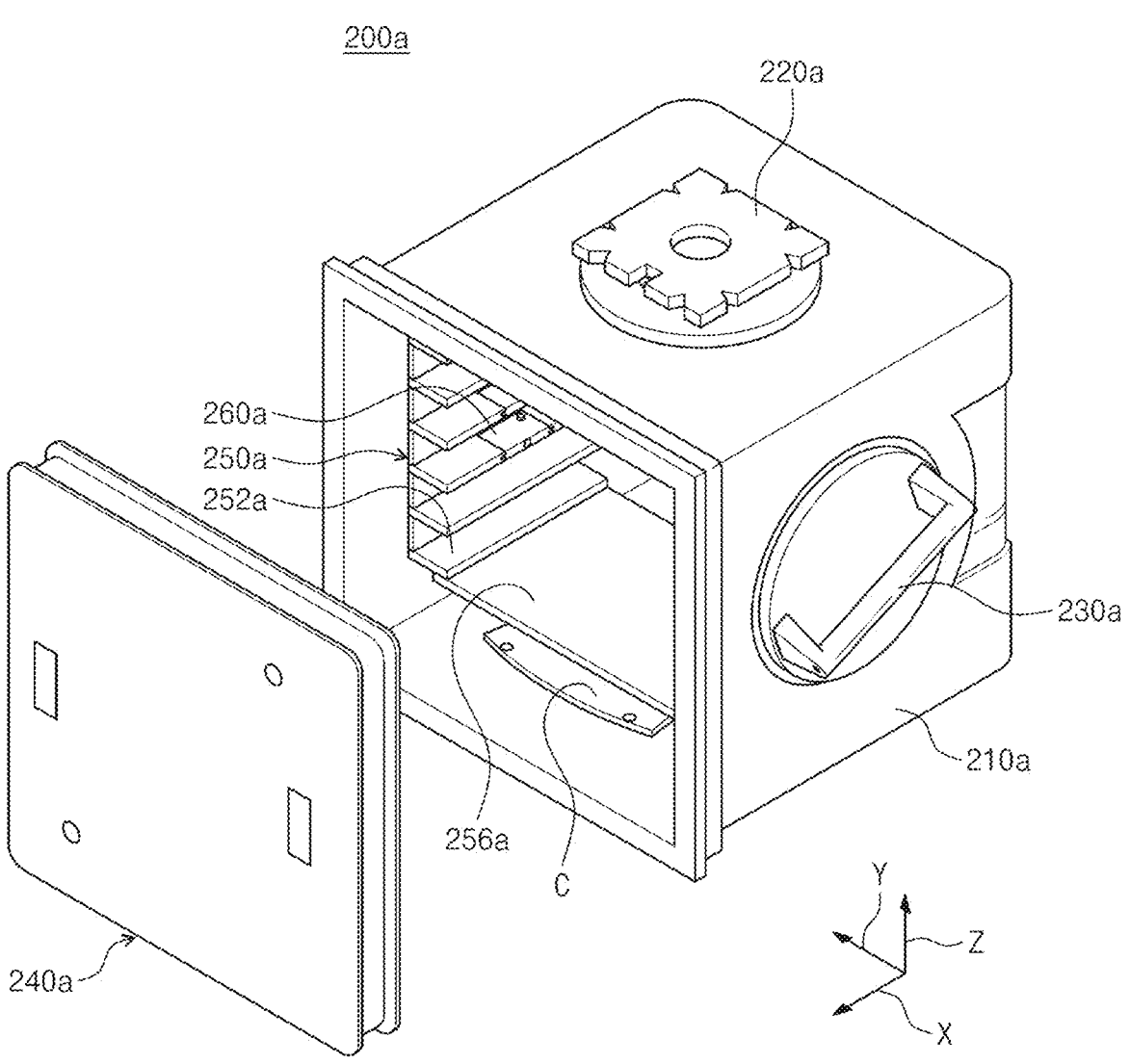
FIG. 2 is a view illustrating a first container of FIG. 1.

FIG. 2 is a view illustrating the first container of FIG. 1. Referring to FIG. 2, the first container 200a may include a housing 210a, a flange 220a, grippers 230a, a door 240a, a support 250a, and a carrier support structure 270a.

The housing 210a may have an inner space. At least one of the ring members R or the carrier C may be accommodated in the inner space of the housing 210a. The flange 220a may be installed on the upper surface of the housing 210a. The flange 220a may be gripped by a gripper of the container transport apparatus, for example, the overhead transport apparatus (OHT).

The grippers 230a may be installed on side surfaces of the housing 210a. The grippers 230a may be installed on opposite side surfaces of the housing 210a. The grippers 230a may be handles that cause the operator to grip the first container 200a. The operator may hold the grippers 230a and directly load the first container 200a onto the load port 110 or unload the first container 200a from the load port 110.

Figure 3:
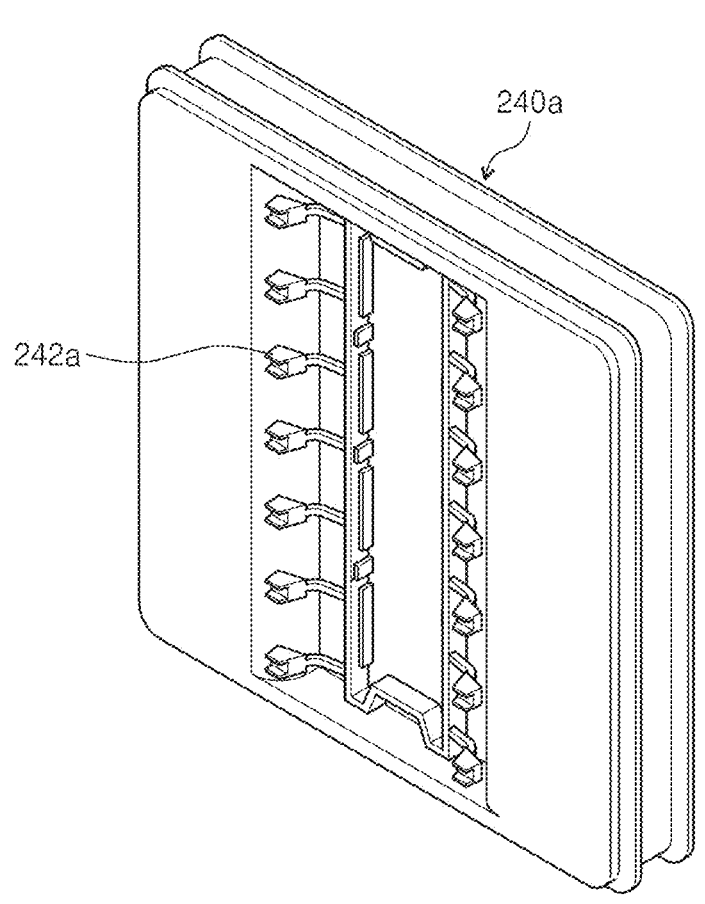
FIG. 3 is a view illustrating a door of FIG. 2.

The door 240a may selectively open and close the inner space of the housing 210a. The door 240a may be combined with the housing 210a to form the inner space. The door 240a may be docked to the front side of the housing 210a, or may be undocked from the front side of the housing 210a. As illustrated in FIG. 3, the door 240a may have, on a surface facing the inner space of the housing 210a among surfaces of the door 240a, retainers 242 clamping the ring members R accommodated in the inner space of the housing 210a. The retainers 242 may have a structure extending in an up/down direction. The retainers 242 may limit a change in the positions of the ring members R, which are accommodated in the inner space of the housing 210a, by clamping lateral portions of the ring members R accommodated in the inner space of the housing 210a.

Referring again to FIG. 2, the support 250a may be provided in the inner space of the housing 210a. The support 250a may support the ring members R in the inner space of the housing 210a. The support 250a may include support slots 252a, a separation plate 256a, and alignment blocks 260a.

Each of the support slots 252a may support a corresponding one of the ring members R. The support slot 252a may support the bottom surface of an edge region of the ring member R. For example, the support slot 252a may support at least part of the bottom surface of the edge region of the ring member R. Furthermore, the support slot 252a may support one side and an opposite side of the bottom surface of the edge region of the ring member R.

One or more support slots 252a may be provided. For example, a plurality of support slots 252a may be provided. Furthermore, the support slots 252a may be arranged in the third direction Z that is the up/down direction. Accordingly, the ring members R supported by the support slots 252a may be accommodated in the inner space of the housing 210a in the up/down direction.

The separation plate 256a may partition the inner space of the housing 210a. For example, the separation plate 256a may divide the inner space of the housing 210a into the space in which the carrier C is accommodated and the space in which the ring members R are accommodated. The separation plate 256a may be coupled to the lowermost support slot 252a among the support slots 252a. For example, the separation plate 256a may be coupled to the lower surface of the lowermost support slot 252a among the support slots 252a. The separation plate 256a, which divides the inner space of the housing 210a into the space in which the carrier C is accommodated and the space in which the ring members R are accommodated, may minimize a risk of collision between the carrier C and a hand of the first transport robot 150 when the hand of the first transport robot 150 enters the inner space of the housing 210a. In addition, when a used ring member R enters the inner space of the housing 210a, the separation plate 256a may minimize delivery of impurities adhering to the ring member R to the carrier C.

Figure 4:
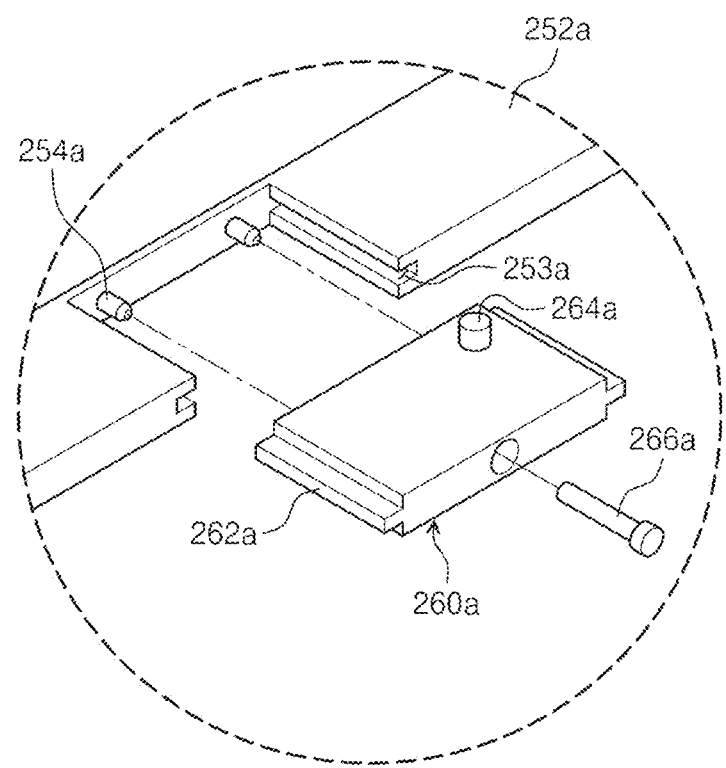
FIG. 4 is a view illustrating one example of support slots and alignment blocks of FIG. 2.

FIG. 4 is a view illustrating one example of the support slots and the alignment blocks of FIG. 2. Referring to FIG. 4, the alignment block 260a may be installed to be detachable from the support slot 252a. The alignment block 260a may be inserted into the support slot 252a. The alignment block 260a inserted into the support slot 252a may be fixedly coupled to the support slot 252a by a coupling means 266a.

A protrusion 262a for guiding the insertion of the alignment block 260a may be formed on at least one of surfaces of the alignment block 260a that make contact with the support slot 252a. For example, protrusions 262a may be formed on left and right side surfaces of the alignment block 260a with respect to the insertion direction of the alignment block 260a. Furthermore, a guide groove 253a having a shape corresponding to the protrusion 262a may be formed on at least one of surfaces of the support slot 252a that make contact with the alignment block 260a. For example, the guide groove 253a may be formed in the position corresponding to the protrusion 262a of the alignment block 260a inserted into the support slot 252a.

Although it has been described as an example that the protrusion 262a is formed on the alignment block 260a and the guide groove 253a is formed on the support slot 252a, the inventive concept is not limited thereto. Alternatively, a guide groove may be formed on the alignment block 260a, and a protrusion may be formed on the support slot 252a.

The support 250a may include at least one guide pin 254a that guides the position of the alignment block 260a that is inserted into the support slot 252a. For example, the guide pin 254a may be provided on one of the contact surfaces between the support slot 252a and the alignment block 260a. The guide pin 254a may be inserted into a hole (not illustrated) that is formed in the alignment block 260a. For example, the hole into which the guide pin 254a is inserted may be formed on the front surface of the alignment block 260a with respect to the direction in which the alignment block 260a is inserted into the support slot 252a. The guide pin 254a may be provided at the position corresponding to the hole formed in the alignment block 260a. The guide groove 253a, the guide pin 254a, the protrusion 262a, and the hole (not illustrated) may help the insertion of the alignment block 260a into the support slot 252a and may prevent the position of the inserted alignment block 260a from being changed and the alignment block 260a from being loosely inserted into the support slot 252a.

The alignment block 260a may include an alignment pin 264a. The alignment pin 264a may be provided on the upper surface of the alignment block 260a. Accordingly, when the alignment block 260a is inserted into the support slot 252a, the support slot 252a may align the position of the ring member R supported thereby.

Figure 5:
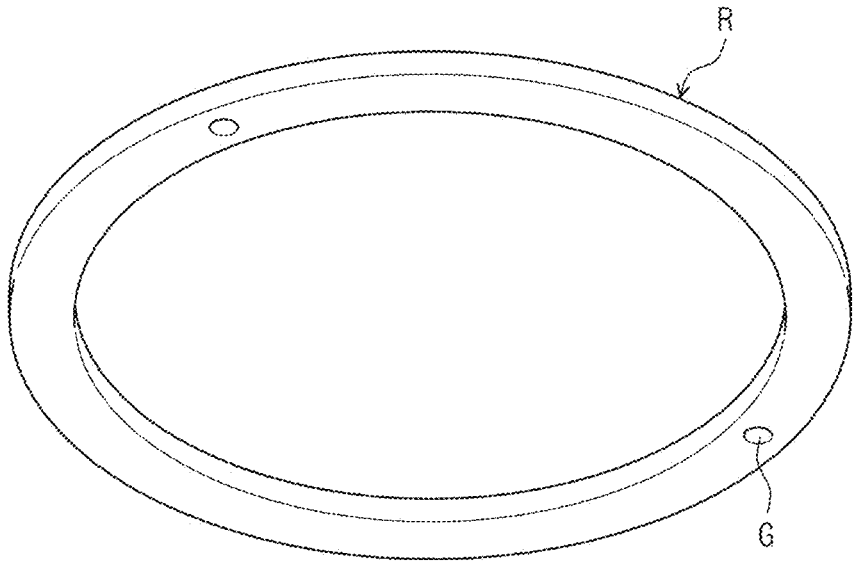
FIG. 5 is a view illustrating a ring member seated on a support of FIG. 2.

FIG. 5 is a view illustrating a ring member seated on the support of FIG. 2. Referring to FIG. 5, the ring member R may have a ring shape. The ring member R may be a process kit provided in the process chamber 370. For example, the ring member R may be a ring member provided in the process chamber 370. The ring member R may be a consumable component provided in the process chamber 370 that treats a substrate W by using plasma. For example, the ring member R may be an ISO ring or a focus ring. An alignment recess G may be formed on the lower surface of the ring member R. A plurality of alignment recesses G may be formed on the lower surface of the ring member R. The alignment pin 264a of the alignment block 260a may be inserted into the alignment recess G to align the position of the ring member R.

That is, the alignment pin 264a according to the embodiment of the inventive concept may be inserted into the recess G formed on the ring member R accommodated in the first container 200a and may align the position of the ring member R. Accordingly, even when the operator has a rather low level of proficiency in work, the operator may align the ring member R in a correct position by only matching the recess G of the ring member R and the position of the alignment pin 264a when placing the ring member R in the first container 200a. Thus, it is possible to solve the problem in which the ring member R transported into the process chamber 370 is not appropriately located in a correct position in the process chamber 370 due to misalignment of the ring member R in the first container 200a. In addition, the alignment pin 264a, which is inserted into the recess G formed on the ring member R, may limit a change in the position of the ring member R when the first container 200a is transported. Thus, it is possible to solve the problem in which the ring member R is not appropriately located in a correct position in the process chamber 370 due to a change in the position of the ring member R in a process of transporting the first container 200a.

Figure 6:
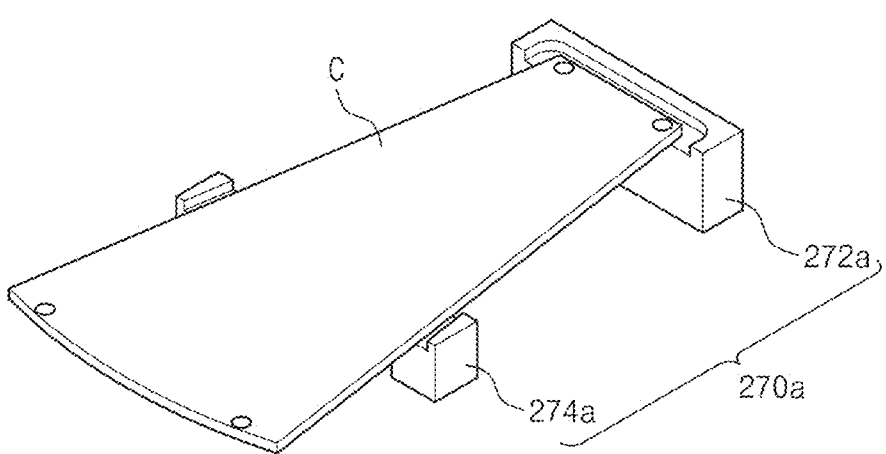
FIG. 6 is a view illustrating a carrier mounted in the first container and a carrier support structure supporting the carrier.

FIG. 6 is a view illustrating the carrier mounted in the first container and the carrier support structure supporting the carrier. Referring to FIG. 6, the carrier C may be used to carry the ring member R. The carrier C may have a substantially trapezoidal shape when viewed from above, and one of surfaces of the carrier C may have a rounded shape. The carrier C may be stored in the inner space of the first container 200a by the carrier support structure 270a. Furthermore, the carrier C may be retrieved by the first transport robot 150 having the hand.

The carrier support structure 270a may support the carrier C. The carrier support structure 270a may support the carrier C in the inner space of the housing 210a. The carrier support structure 270a may be disposed under the support 250a. The carrier support structure 270a may be installed in the lower one of the spaces divided from each other by the separation plate 256a. The carrier support structure 270a may include a first support structure 272a and a second support structure 274a. A pair of second support structures 274a may be provided. The first support structure 272a and the pair of second support structures 274a may support the lower surface of the carrier C in a manner of a three-point support.

The substrate treating apparatus 1000 according to the embodiment of the inventive concept may transport an unused ring member R accommodated in the first container 200a into the process chamber 370 by using the first transport robot 150 and a second transport robot 350 that will be described below. Furthermore, the substrate treating apparatus 1000 may transport the ring member R used in the process chamber 370 into the first container 200a by using the first transport robot 150 and the second transport robot 350 that will be described below. That is, the substrate treating apparatus 1000 may automatically perform the replacement of the ring member R.

Figure 7:
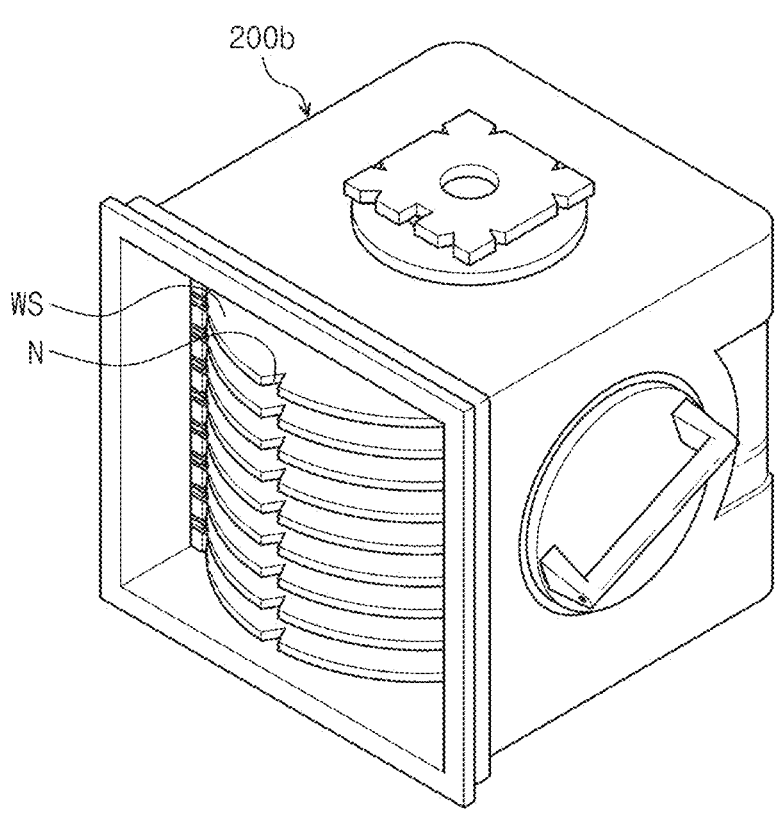
FIG. 7 is a view illustrating a second container of FIG. 1.

FIG. 7 is a view illustrating the second container of FIG. 1. Referring to FIG. 7, the second container 200b according to an embodiment of the inventive concept may have the substrate type sensors WS accommodated therein. The substrate type sensors WS may be wafer type sensors. Each of the substrate type sensors WS may be transported into a process space 511 of a process chamber 510 to be described below and may monitor a substrate treating process performed in the process chamber 510. The substrate type sensor WS may have an image acquisition module that is transported into the process chamber 510 to be described below and that obtains an image of the process space 511 of the process chamber 510. Furthermore, the substrate type sensor WS may have a notch N formed therein, and the notch N may be used to secure centering of the substrate type sensor WS.

The substrate treating apparatus 1000 according to the embodiment of the inventive concept may transport the substrate type sensor WS accommodated in the second container 200a into the process chamber 370 by using the first transport robot 150 and the second transport robot 350 that will be described below.

Furthermore, the substrate treating apparatus 1000 may transport the substrate type sensor WS used to perform measurement in the process chamber 370 into the second container 200a by using the first transport robot 150 and the second transport robot 350 that will be described below.

The index chamber 130 may be provided between the load ports 110 and the process unit 300. That is, the load ports 110 may be connected to the index chamber 130. The inside of the index chamber 130 may be maintained in an atmospheric atmosphere. The side buffers 170, which are storage units, may be installed on one side of the index chamber 130. Furthermore, the first transport robot 150 may be provided in the index chamber 130. The first transport robot 150 may transport the substrates W, the substrate type sensors WS, and the ring members R between the containers 200a, 200b, and 200c seated on the load portions 110, a load-lock chamber 310 to be described below, and the side buffers 170. That is, the first transport robot 150 may unload the substrate type sensors WS from the second container 200b.

The process unit 300 may include the load-lock chamber 310, a transfer chamber 330, the second transport robot 350, and the process chambers 370.

The load-lock chamber 310 may be disposed between the transfer chamber 330 and the index chamber 130. That is, the load-lock chamber 310 may be connected to the index chamber 130 and the transfer chamber 330. The load-lock chamber 310 may provide a space in which the substrates W and/or the ring members R are temporarily stored. The load-lock chamber 310 may be equipped with a non-illustrated vacuum pump and a non-illustrated valve, and the atmosphere in the load-lock chamber 310 may be switched between an atmospheric atmosphere and a vacuum atmosphere. Because the inside of the transfer chamber 330 to be described below is maintained in a vacuum atmosphere, the atmosphere in the load-lock chamber 310 may be switched between an atmospheric atmosphere and a vacuum atmosphere to transport the substrates W and the ring members R between the transfer chamber 330 and the index chamber 130.

The transfer chamber 330 may be disposed between the load-lock chamber 310 and the process chambers 370. As described above, the inside of the transfer chamber 330 may be maintained in a vacuum atmosphere. Furthermore, the second transport robot 350 may be provided in the transfer chamber 330. The second transport robot 350 may transport the substrates W or the ring members R between the load-lock chamber 310 and the process chambers 370. The second transport robot 350 may transport the substrates W or the ring members R between process spaces of the process chambers 370 and the transfer chamber 330. The second transport robot 350 includes a hand 352. The second transport robot 350 may be configured to move the hand 352 in the first direction X, the second direction Y, or the third direction Z. Furthermore, the second transport robot 350 may be configured to rotate the hand 352 about an axis facing the third direction Z.

The process chambers 370 may be connected to the transfer chamber 330. The process chambers 370 may receive the substrates W from the second transport robot 350 provided in the transfer chamber 330 and may treat the substrates W. The process chambers 370 may be chambers that perform processes on the substrates W. For example, the process chambers 370 may be liquid treatment chambers that treat the substrates W by dispensing treatment liquids onto the substrates W. Alternatively, the process chambers 370 may be plasma chambers that treat the substrates W using plasma. In another case, some of the process chambers 370 may be liquid treatment chambers that treat the substrates W by dispensing the treatment liquids onto the substrates W, and the other process chambers 370 may be plasma chambers that treat the substrates W using plasma. However, without being limited thereto, the substrate treating processes performed in the process chambers 370 may be diversely modified with well-known substrate treating processes. When the process chambers 370 are plasma chambers that treat the substrates W using plasma, the plasma chambers may be chambers that perform etching or ashing processes of removing thin films on the substrates W using plasma. However, without being limited thereto, the plasma treatment process performed in the process chambers 370 may be diversely modified with well-known plasma treatment processes. A detailed structure of each of the process chambers 370 will be described below.

Although FIG. 1 illustrates an example that the transfer chamber 330, when viewed from above, has a substantially hexagonal shape and four process chambers 370 are connected to the transfer chamber 330, the inventive concept is not limited thereto. For example, the shape of the transfer chamber 330 and the number of process chambers 370 may be diversely modified depending on the need of a user and the number of substrates required to be treated.

The controller 700 may control the substrate treating apparatus 1000. The controller 700 may control the index unit 100 and the process unit 300. The controller 700 may control the first transport robot 150 and the second transport robot 350. To treat the substrates W using plasma in the process chambers 370, the controller 700 may control substrate treating apparatuses provided in the process chambers 370.

The controller 700 may include a process controller, a user interface, and a storage unit. The process controller may include a microprocessor (a computer) that executes the control of the substrate treating apparatus 1000. The user interface may include a keyboard through which the operator inputs a command to manage the substrate treating apparatus 1000 or a display that visually displays an operational state of the substrate treating apparatus 1000. The storage unit may store a process recipe, such as a control program for executing a process in the substrate treating apparatus 1000 under the control of the process controller or a program for causing each component to execute a process according to various types of data and process conditions. Furthermore, the user interface and the storage unit may be connected to the process controller. The process recipe may be stored in a storage medium of the storage unit. The storage medium may be a hard disk, a portable disk such as CD-ROM or DVD, or a semiconductor memory such as a flash memory.

Figure 8:
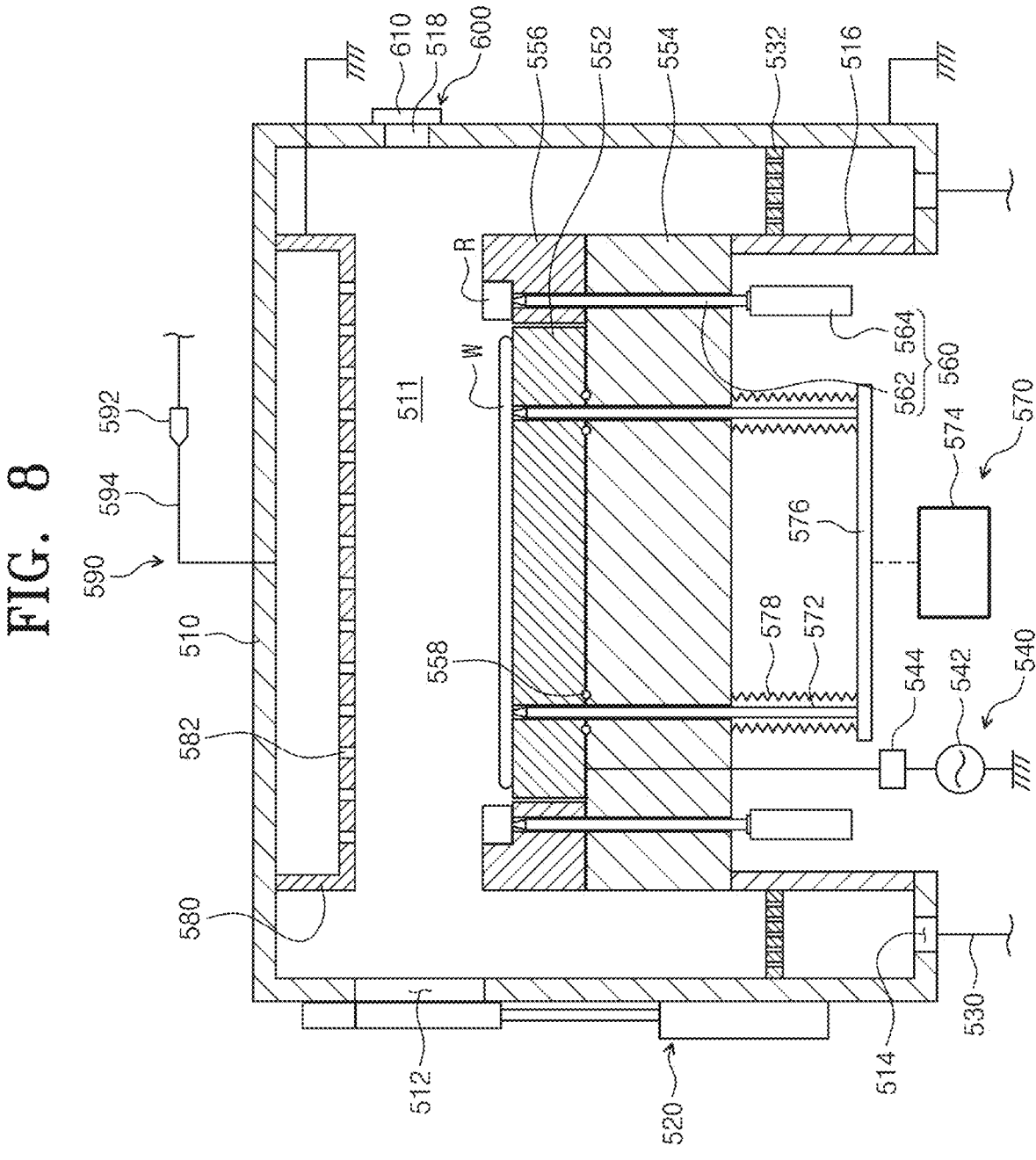
FIG. 8 is a view illustrating a substrate treating apparatus provided in a process chamber of FIG. 1.

FIG. 8 is a view illustrating a substrate treating apparatus provided in the process chamber of FIG. 1. Hereinafter, the substrate treating apparatus 500 provided in the process chamber 370 will be described in detail with reference to FIG. 8. The substrate treating apparatus 500 may treat a substrate W by delivering plasma to the substrate W.

The substrate treating apparatus 500 may include the process chamber 510, a gate valve 520, an exhaust line 530, a power supply unit 540, a support unit 550, a ring lift module 560, a substrate lift module 570, a baffle plate 580, and a gas supply unit 590.

The process chamber 510 may have the process space 511. The process chamber 510 may be grounded. The process chamber 510 may provide the process space 511 in which the substrate W is treated. The process space 511 of the process chamber 510 may be maintained in a substantially vacuum atmosphere when the substrate W is treated. The process chamber 510 may have, in a sidewall thereof, an entrance/exit opening 512 through which the substrate W or a ring member R enters and exits the process chamber 510. The gate valve 520 may selectively open and close the entrance/exit opening 512.

The process chamber 510 may have an exhaust hole 514 formed in the bottom thereof. The exhaust line 530 may be connected to the exhaust hole 514. The exhaust line 530 may release a process gas supplied into the process space 511 of the process chamber 510 and process by-products to the outside of the process chamber 510 through the exhaust hole 514. An exhaust plate 532 may be provided over the exhaust hole 514 to more uniformly evacuate the process space 511. The exhaust plate 532 may have a substantially ring shape when viewed from above. Furthermore, the exhaust plate 532 may have at least one exhaust hole formed therein. The operator may select an exhaust plate 532 capable of uniformly evacuating the process space 511, among a plurality of exhaust plates 532 having various shapes and sizes and may install the exhaust plate 532 over the exhaust hole 514.

The process chamber 510 may further include a support member 516. The support member 516 may support at least a part of components of the support unit 550 to be described below. For example, the support member 516 may be configured to support a lower portion of an insulating plate 554 of the support unit 550.

The process chamber 510 may include a view port 518. A light receiving member 610 of a measurement unit 600 that measures the degree of wear of the ring member R may be installed on the view port 518. The light receiving member 610 may receive light L (e.g., a laser) emitted by an irradiation member 620 to be described below. The light receiving member 610 may receive the light L emitted in a horizontal direction by the irradiation member 620 to be described below.

The power supply unit 540 may generate RF power for exciting the process gas supplied by the gas supply unit 590, which will be described below, into plasma. The power supply unit 540 may include a power supply 542 and a matcher 544. The power supply 542 and the matcher 544 may be disposed in-line with a power transmission line. The power transmission line may be connected to a chuck 552.

The support unit 550 may support the substrate W in the process space 511 of the process chamber 510. The support unit 550 may include the chuck 552, the insulating plate 554, a quartz ring 556, and a sealing member 558.

The chuck 552 may have a support surface that supports the substrate W. The chuck 552 may support the substrate W and may clamp the supported substrate W. For example, the chuck 552 may include an electrostatic plate (not illustrated) inside and may electro-statically clamp the substrate W. That is, the chuck 552 may be an electrostatic chuck. However, without being limited thereto, the chuck 552 may clamp the substrate W by vacuum pressure.

The insulating plate 554 may have a circular plate shape when viewed from above. The above-described chuck 552 and the quartz ring 556 to be described below may be placed on the insulating plate 554. The insulating plate 554 may be formed of a dielectric substance. For example, the insulating plate 554 may be formed of a material including ceramic.

The quartz ring 556 may be formed of a material containing quartz. The quartz ring 556 may have a ring shape when viewed from above. The quartz ring 556 may have a shape surrounding the chuck 552 when viewed from above. The quartz ring 556, when viewed from above, may have a shape surrounding the substrate W supported on the chuck 552.

The quartz ring 556 may have a step shape in which the height of an inner upper surface differs from the height of an outer upper surface. For example, the inner upper surface of the quartz ring 556 may be in a lower position than the outer upper surface of the quartz ring 556. The ring member R (e.g., a focus ring) may be placed on the inner upper surface of the quartz ring 556.

The sealing member 558 may be provided between the insulating plate 554 and the chuck 552 to prevent arcing in the clearance between pin holes formed in the insulating plate 554 and the chuck 552.

The ring lift module 560 may vertically move the ring member R placed on the inner upper surface of the quartz ring 556. The ring lift module 560 may include ring lift pins 562 and a ring lift pin actuator 564. The ring lift pins 562 may be vertically moved along pin holes formed in the insulating plate 554 and/or the quartz ring 556. The ring lift pins 562 may be vertically moved by the ring lift pin actuator 564. The ring lift pin actuator 564 may be a pneumatic or hydraulic cylinder or a motor.

The substrate lift module 570 may vertically move the substrate W placed on the chuck 552. The substrate lift module 570 may include substrate lift pins 572, a substrate lift pin actuator 574, a lifting plate 576, and a bellows 578. The substrate lift pins 572 may be vertically moved along the pin holes formed in the insulating plate 554 and/or the chuck 552. The substrate lift pins 572 may be coupled with the lifting plate 576 that receives power from the substrate lift pin actuator 574. The substrate lift pins 572 may be vertically moved by a vertical movement of the lifting plate 576. The bellows 578 for maintaining air-tightness may surround the connecting portions between the lifting plate 576 and the substrate lift pins 572.

The baffle plate 580 may be provided over the support unit 550. The baffle plate 580 may be formed of an electrode material. The baffle plate 580 may have at least one baffle hole 582 formed therein. For example, a plurality of baffle holes 582 may be formed in the baffle plate 580. The baffle holes 582, when viewed from above, may be uniformly formed in the entire area of the baffle plate 580. The baffle plate 580 may uniformly deliver, to the substrate W, the process gas supplied by the gas supply unit 590 to be described below.

The gas supply unit 590 may supply the process gas into the process space 511 of the process chamber 510. The process gas may be excited into plasma by the above-described power supply unit 540. The gas supply unit 590 may include a gas supply source 592 and a gas supply line 594. One end of the gas supply line 594 may be connected to the gas supply source 592, and an opposite end of the gas supply line 594 may be connected to the top of the process chamber 510. Accordingly, the process gas delivered by the gas supply source 592 may be supplied into an upper area of the baffle plate 580 through the gas supply line 594. The process gas supplied into the upper area of the baffle plate 580 may be introduced into the process space 511 of the process chamber 510 through the baffle holes 582.

Hereinafter, a method for measuring a degree of wear of a ring member R according to an embodiment of the inventive concept will be described. To perform the method for measuring the degree of wear of the ring member R, the controller 700 may control the substrate treating apparatus 1000. For example, to perform the method for measuring the degree of wear of the ring member R, the controller 700 may control the measurement unit 600, the ring lift module 560, and the substrate lift module 570.

Figure 9:
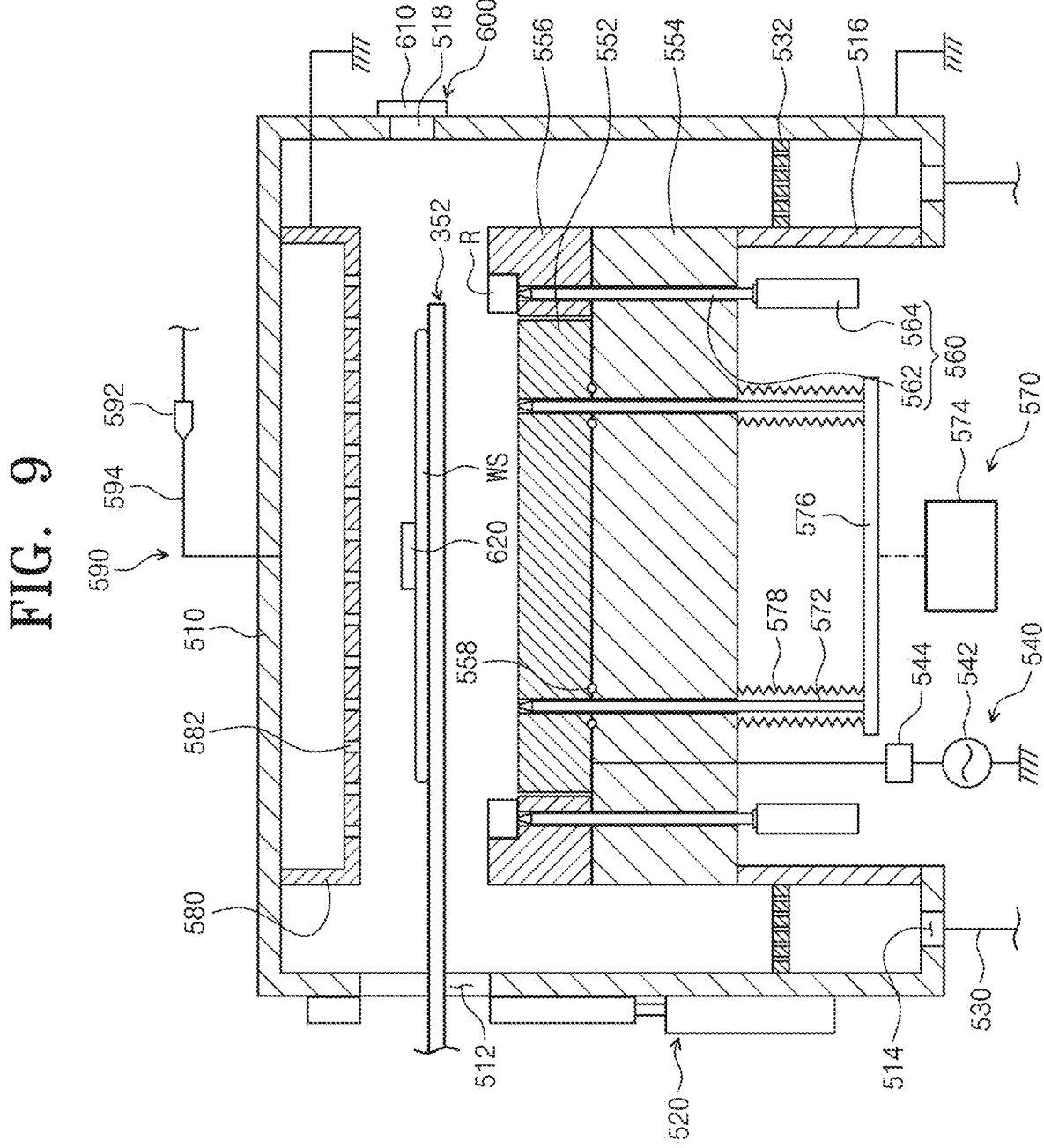
FIG. 9 is a view illustrating a state in which a substrate type sensor enters a process space of FIG. 8.
Figure 10:
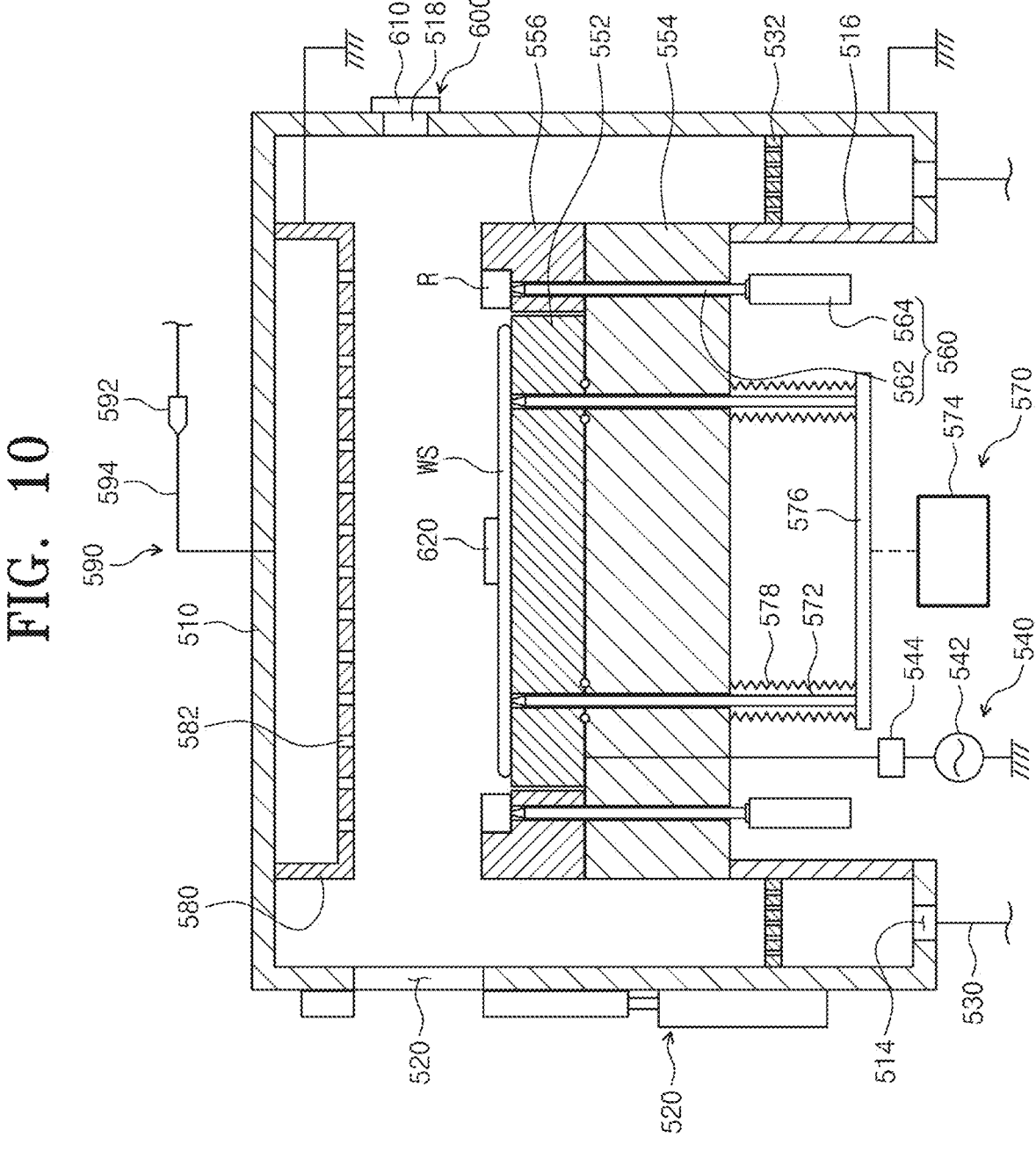
FIG. 10 is a view illustrating a state in which the substrate type sensor is seated on a support unit of FIG. 8.
Figure 11:
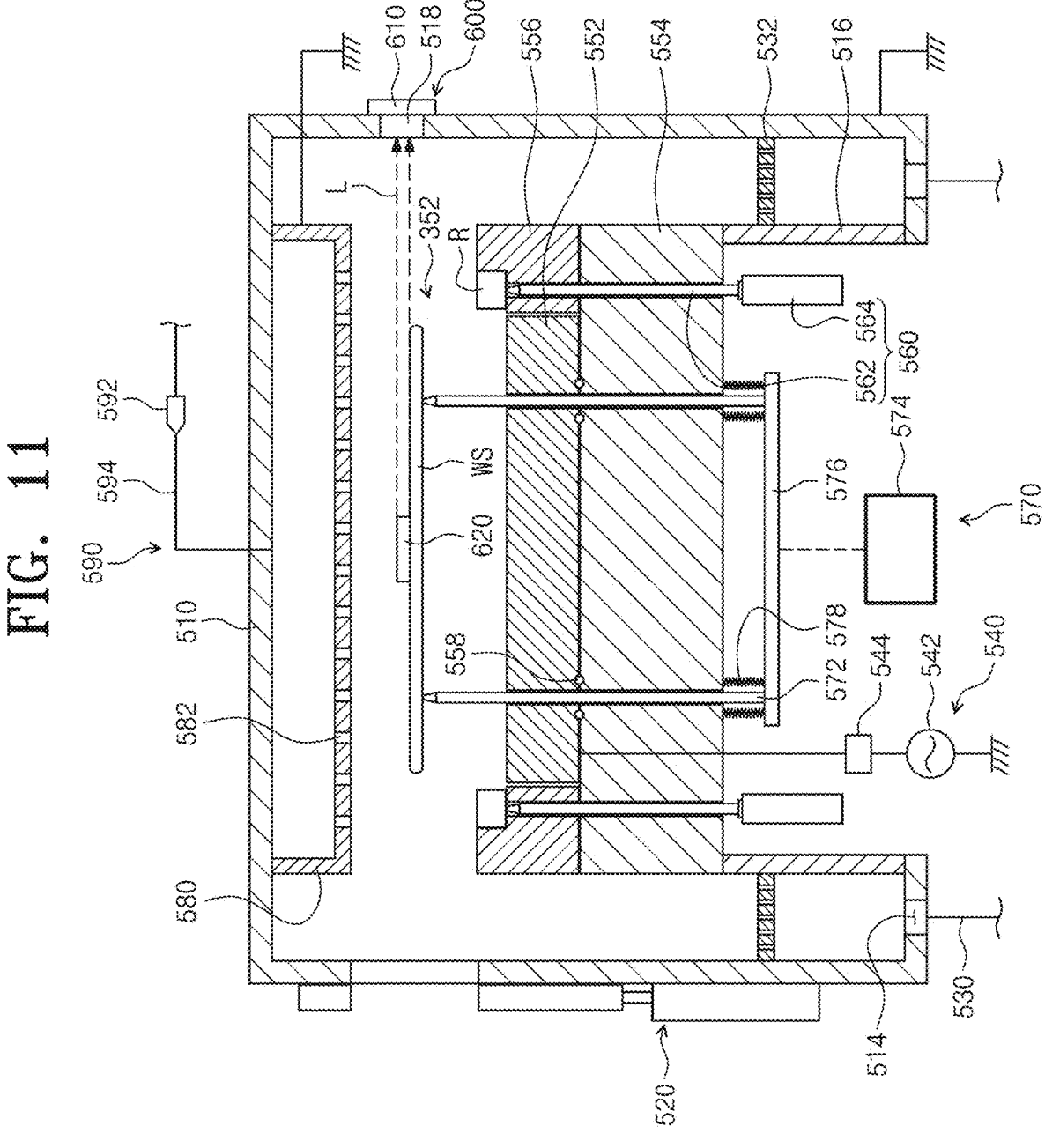
FIG. 11 is a view illustrating a state in which an irradiation member attached to the substrate type sensor emits light toward a light receiving member.
Figure 12:
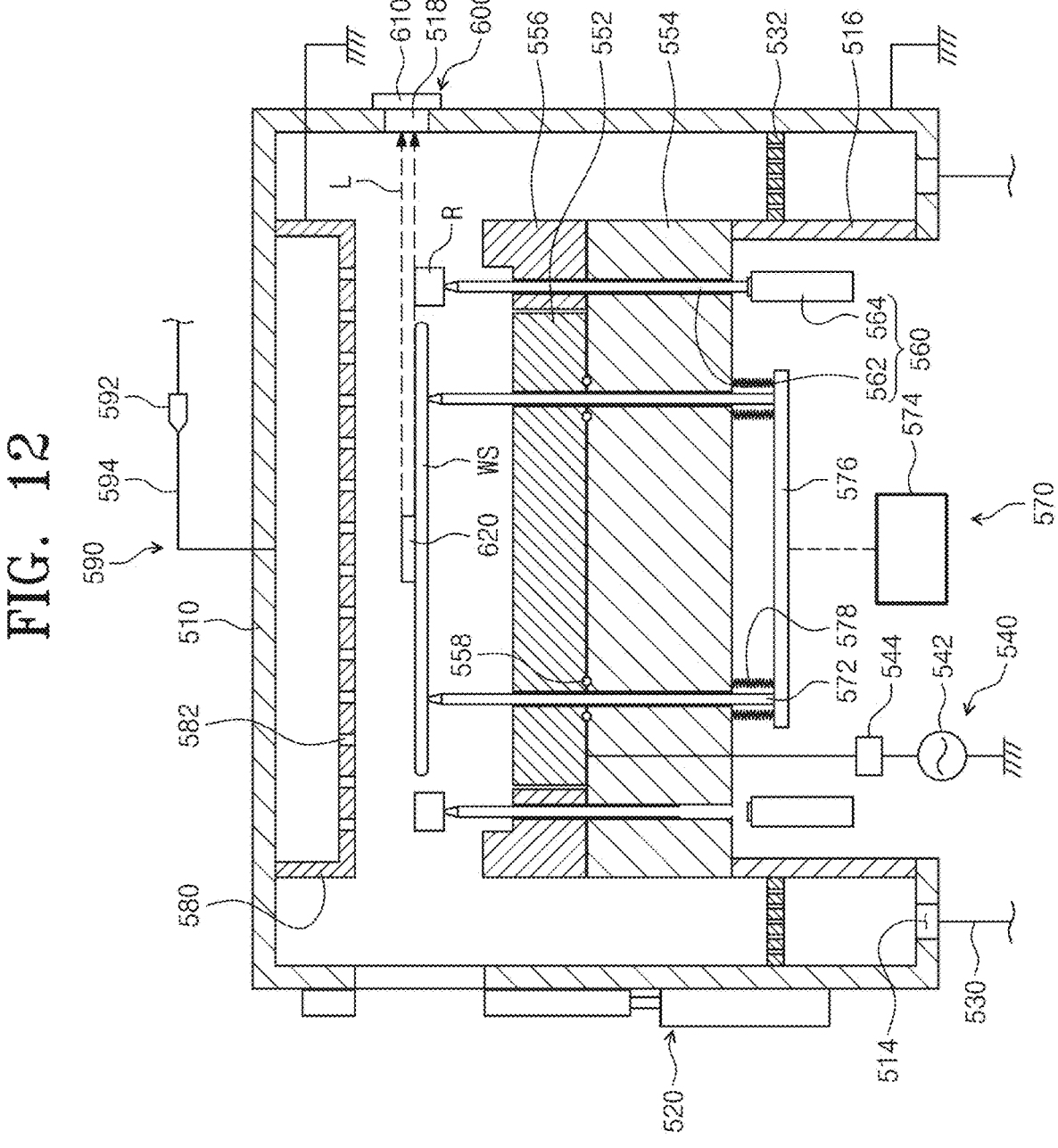
FIG. 12 illustrates a ring member raised by a ring lift module, and the substrate treating apparatus when the amount of light received by the light receiving member decreases.

The hand 352 of the second transport robot 350 may load the above-described substrate type sensor WS into the process space 511 of the process chamber 510 (refer to FIG. 9). The substrate type sensor WS may have the above-described irradiation member 620 attached thereto. The substrate type sensor WS may be loaded onto the substrate lift pins 572 of the substrate lift module 570 and may be seated on the chuck 552 of the support unit 550 (refer to FIG. 10).

The substrate lift module 570 may move the substrate type sensor WS upward. The substrate lift module 570 may raise the substrate type sensor WS to the height corresponding to the view port 518. When the substrate type sensor WS is raised to the height corresponding to the view port 518, the irradiation member 620 attached to the substrate type sensor WS may emit light L (e.g., a laser) in a horizontal direction. For example, the irradiation member 620 may emit a laser having a set width in the horizontal direction toward the light receiving member 610 (refer to FIG. 11).

The ring lift module 560 may slowly raise the ring member R. For example, the ring lift module 560 may move the ring member R to the position where the ring member R interferes with the light L (refer to FIG. 12). The controller 700 may calculate the degree of wear of the ring member R, based on the height (hereinafter, referred to as the "measured height") of the ring lift pins 562 at the time point when the amount of light L received by the light receiving member 610 decreases.

Figure 13:
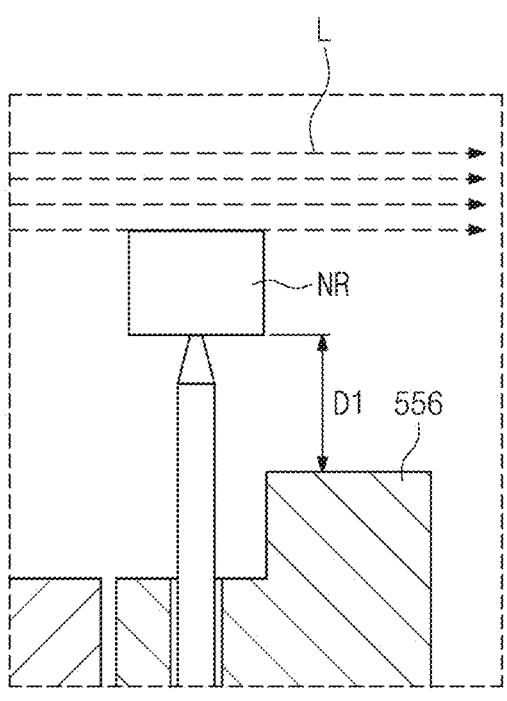
FIG. 13 illustrates a new ring member raised by the ring lift module, and the height of a ring lift pin when the amount of light received by the light receiving member decreases.
Figure 14:
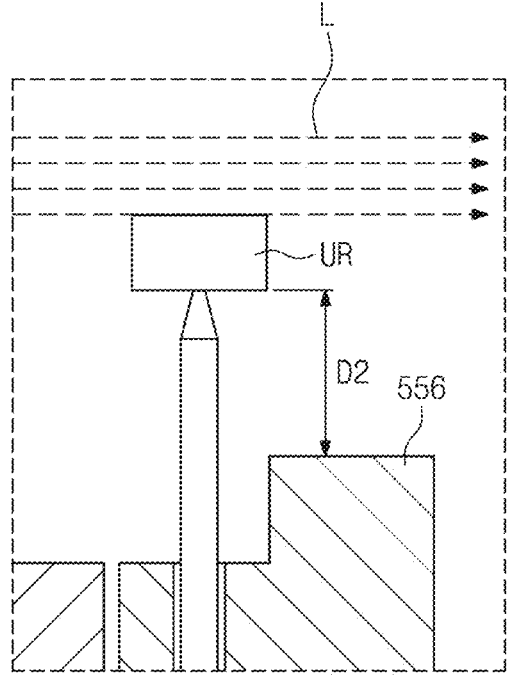
FIG. 14 illustrates a used ring member raised by the ring lift module, and the height of the ring lift pin when the amount of light received by the light receiving member decreases.

More specifically, as illustrated in FIG. 13, the ring lift module 560 may slowly raise a new ring member NR that is not used. The controller 700 may store the height (hereinafter, referred to as the "reference height") of the ring lift pins 562 at the time point when the amount of light received by the light receiving member 610 decreases due to interference of the new ring member NR with the light L. The reference height may be calculated based on the gap D1 between the ends of the ring lift pins 562 and the upper surface of the quartz ring 556.

In the state in which the controller 700 stores the reference height, the ring lift module 560 may slowly raise a used ring member UR. The controller 700 may measure the height (that is, the measured height) of the ring lift pins 562 at the time point when the amount of light L received by the light receiving member 610 decreases. The measured height may be calculated based on the gap D2 between the ends of the ring lift pins 562 and the upper surface of the quartz ring 556.

Although it has been described that the reference height and the measured height are calculated based on the gap between the ends of the ring lift pins 562 and the upper surface of the quartz ring 556, this is illustrative, and the height of the ring lift pins 562 may be calculated based on the revolutions per minute of the ring lift pin actuator 564 that is a motor, or may be calculated by various other methods.

The controller 700 may calculate the degree of wear (e.g., the etch amount) of the ring member R, based on the difference between the reference height and the measured height. For example, the controller 700 may calculate the degree of wear of the ring member R, based on the fact that the degree of wear of the ring member R is proportional to the difference between the reference height and the measured height.

According to the embodiment of the inventive concept, the substrate treating apparatus 1000 may measure the degree of wear of the ring member R even though the operator does not directly open the process chamber 510. Furthermore, the degree of wear of the ring member R may be measured, based on the amount of light received by the light receiving member 610. That is, the method for measuring the degree of wear of the consumable component according to the embodiment of the inventive concept may be performed without physical contact. Accordingly, it is possible to solve the problem in which the ring member R is damaged (e.g., scratched) in measurement of the degree of wear of the ring member R that is a consumable component.

Figure 15:
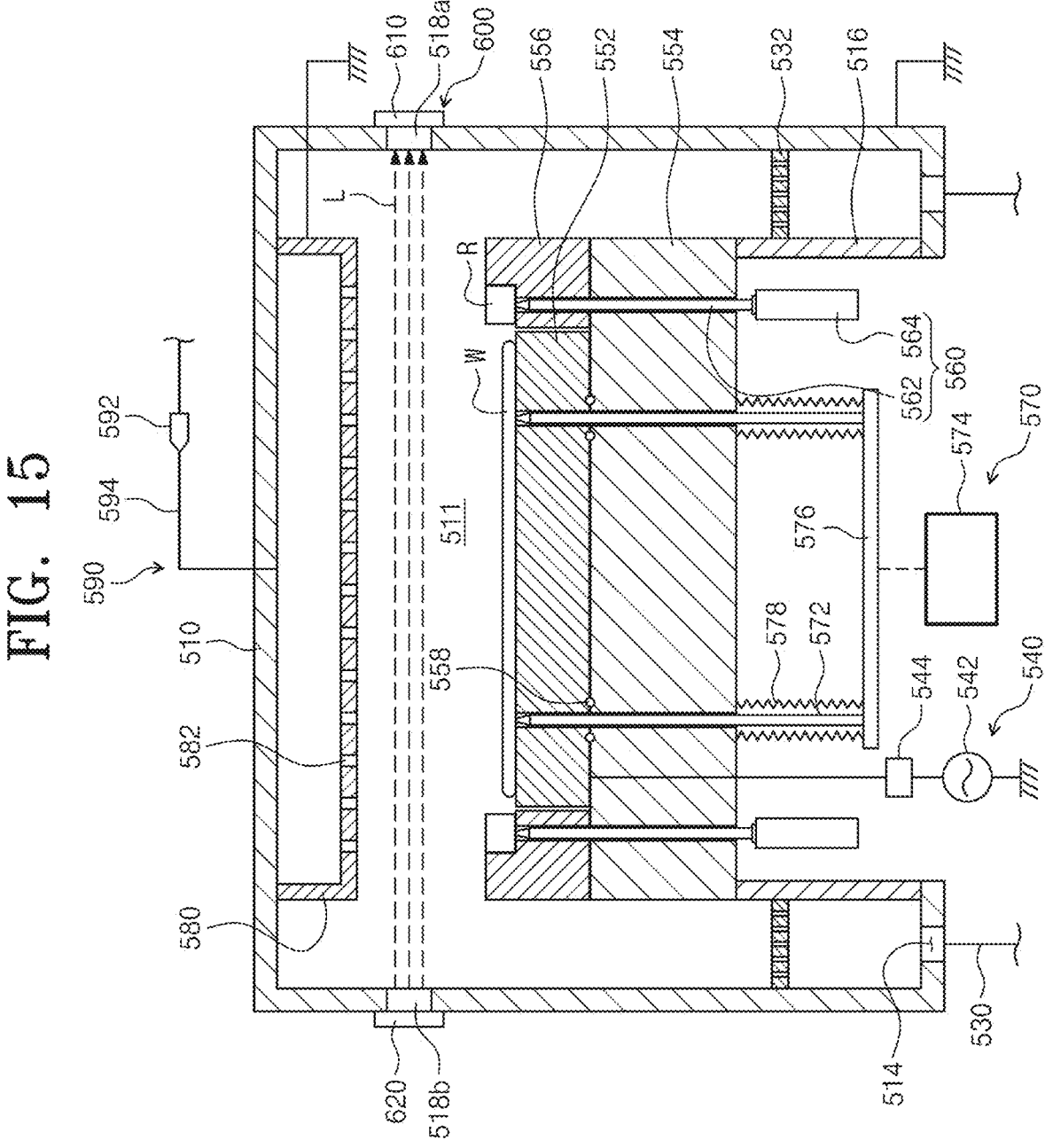
FIG. 15 is a view illustrating a substrate treating apparatus according to another embodiment of the inventive concept.

Although it has been described that the irradiation member 620 is attached to the substrate type sensor WS, the inventive concept is not limited thereto. For example, as illustrated in FIG. 15, the process chamber 510 may include a first view port 518*a* and a second view port 518*b*. The light receiving member 610 may be installed on the first view port 518*a*. The irradiation member 620 may be installed on the second view port 518*b*.

Figure 16:
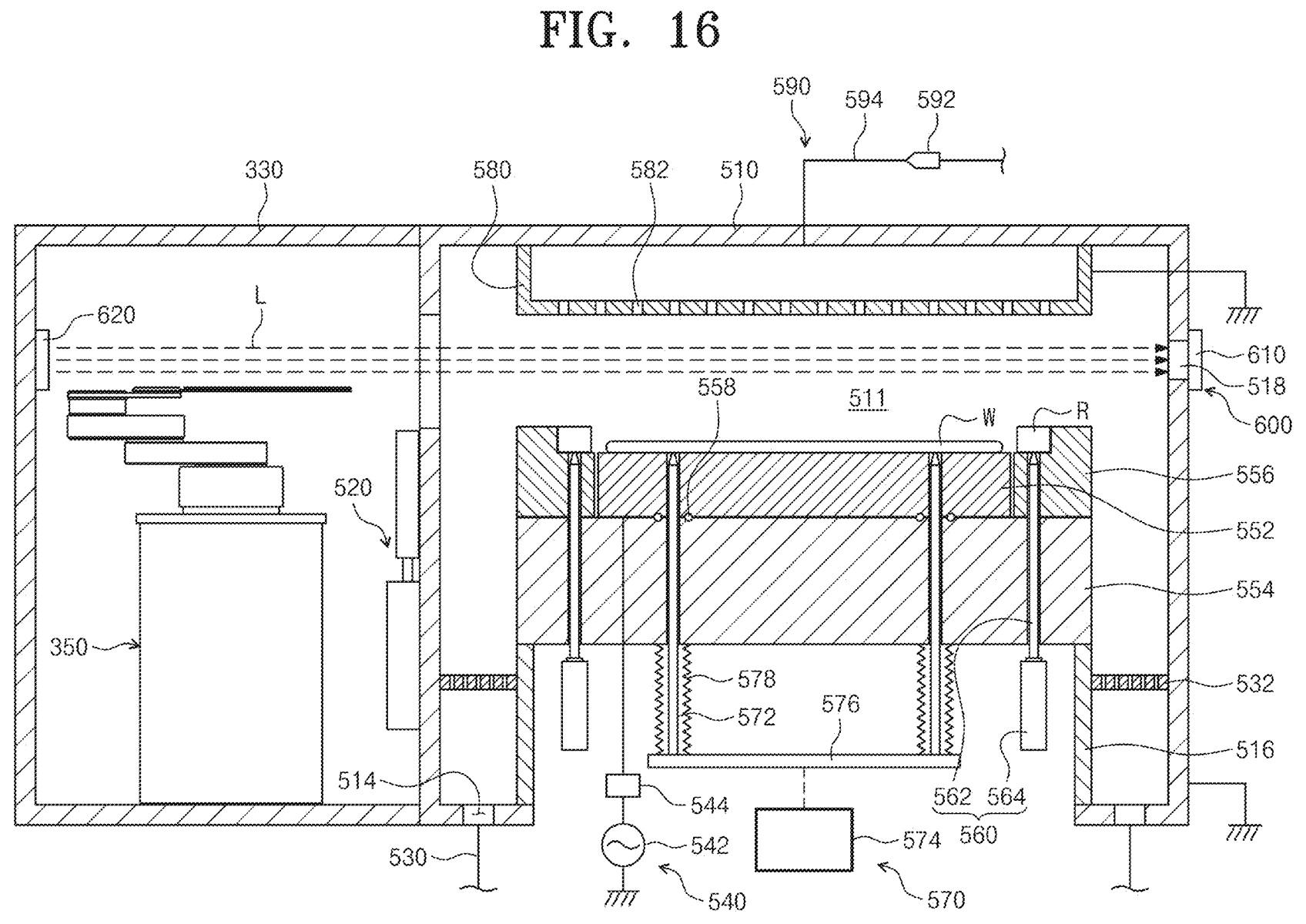

Alternatively, as illustrated in FIG. 16, the irradiation member 620 may be installed in the transfer chamber 330 that transfers the substrates W into the process chamber 510. The irradiation member 620 may emit light L toward the light receiving member 610 in the state in which the entrance/exit opening 512 of the process chamber 510 is opened by the gate valve 520. That is, the light receiving member 610 and the irradiation member 620 may be provided at the same height. Furthermore, the entrance/exit opening 512 of the process chamber 510, the irradiation member 620, and the light receiving member 610 may be disposed along a virtual straight line when viewed from above. Accordingly, when the irradiation member 620 emits the light L in the horizontal direction, the light L emitted by the irradiation member 620 may reach the light receiving member 610 through the entrance/exit opening 512.

According to the embodiments of the inventive concept, a degree of wear of a consumable component may be effectively measured.

In addition, according to the embodiments of the inventive concept, an etch amount of a ring member, for example, a focus ring may be effectively measured.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a process chamber having a process space;
   a support unit configured to support the substrate in the process space;
   a lift pin module having a first lift pin configured to move a consumable component on the support unit in an up/down direction;
   a measurement unit configured to measure a degree of wear of the consumable component, the measurement unit having a light receiving member configured to receive light emitted in a horizontal direction;
   a substrate lift module configured to vertically move the substrate placed on the support unit; and
   a view port on which the light receiving member is installed,
   wherein an irradiation member configured to emit the light is attached to a substrate type sensor transported into the process space and configured to monitor a substrate treating process performed in the process chamber,
   wherein the apparatus further comprises a controller,
   wherein when measuring the degree of wear of the consumable component,
      the controller is configured to control the substrate lift module to raise the substrate type sensor to a height corresponding to the view port, and
      control the lift pin module to move the consumable component upward to a position where the consumable component interferes with the light,
   wherein the light emitted by the irradiation member is a laser, and
   wherein, in the measuring the degree of wear of the consumable component,
      the position where the consumable component interferes with the light is a position such that an upper surface of the first lift pin of the lift pin module is above an upper surface of the support unit, and
      the height corresponding to the view port is a height such that an upper surface of a second lift pin of the substrate lift module is above the upper surface of the support unit.

2. The apparatus of claim 1, wherein the controller is configured to calculate the degree of wear of the consumable component, based on a measured height that is a height of the first lift pin when an amount of light received by the light receiving member decreases.

3. The apparatus of claim 2, wherein the controller is configured to control the lift pin module such that the first lift pin moves a new consumable component to a position where the new consumable component interferes with the light, wherein the controller stores a reference height that is a height of the first lift pin when the new consumable component interferes with the light and an amount of light received by the light receiving member decreases; and
   to calculate the degree of wear of the consumable component, based on a difference between the reference height and the measured height.

4. The apparatus of claim 1, wherein the consumable component has a ring shape.

5. The apparatus of claim 1, wherein an inner diameter of the consumable component is greater than a diameter of the substrate.

6. The apparatus of claim 5, wherein the second lift pin of the substrate lift module is configured to move separately from the first lift pin of the lift pin module.

7. The apparatus of claim 6, wherein
   the lift pin module comprises a ring lift pin actuator configured to provide power to the lift pin module, and
   wherein the substrate lift module comprises a substrate lift pin actuator and a lifting plate coupled to the second lift pin and is configured to receive power from the substrate lift pin actuator.

8. An apparatus for treating a substrate, the apparatus comprising:
   a process chamber having a process space;

a gas supply unit configured to supply a process gas into the process space;

a power supply unit configured to excite the process gas into plasma;

a support unit configured to support the substrate in the process space;

a lift pin module including a first lift pin configured to move a ring member on the support unit in an up/down direction and a lifting unit configured to raise and lower the first lift pin; and a measurement unit configured to measure an etch amount of the ring member, the measurement unit having a light receiving member configured to receive light emitted in a horizontal direction, a substrate lift module configured to vertically move the substrate placed on the support unit, and a view port on which the light receiving member is installed, wherein an irradiation member configured to emit the light is attached to a substrate type sensor transported into the process space and configured to monitor a substrate treating process performed in the process chamber, wherein the apparatus further comprises a controller, wherein when measuring a degree of wear of the ring member, the controller is configured to control the substrate lift module to raise the substrate type sensor to a height corresponding to the view port, and control the lift pin module to move the ring member upward to a position where the ring member interferes with the light, wherein the light emitted by the irradiation member is a laser, and wherein, in the measuring the degree of wear of the ring member, the position where the ring member interferes with the light is a position such that an upper surface of the first lift pin of the lift pin module is above an upper surface of the support unit, and the height corresponding to the view port is a height such that an upper surface of a second lift pin of the substrate lift module is above the upper surface of the support unit.

9. The apparatus of claim 8, wherein the controller is configured to calculate the etch amount of the ring member, based on a measured height that is a height of the first lift pin when an amount of light received by the light receiving member decreases.

10. The apparatus of claim 9, wherein the controller is configured to control the first lift pin to move a new ring member to a position where the new ring member interferes with the light, wherein the controller stores a reference height that is a height of the first lift pin when the new ring member interferes with the light and an amount of light received by the light receiving member decreases; and to calculate the etch amount of the ring member, based on a difference between the reference height and the measured height.

11. The apparatus of claim 8, wherein an inner diameter of the ring member is greater than a diameter of the substrate.

12. The apparatus of claim 11, wherein the second lift pin of the substrate lift module is configured to move separately from the first lift pin of the lift pin module.

13. The apparatus of claim 12, wherein the lift pin module comprises a ring lift pin actuator configured to provide power to the lift pin module, and wherein the substrate lift module comprises a substrate lift pin actuator and a lifting plate coupled to the second lift pin and is configured to receive power from the substrate lift pin actuator.

\* \* \* \* \*